US007133303B2

(12) United States Patent
Ito et al.

(10) Patent No.: US 7,133,303 B2
(45) Date of Patent: Nov. 7, 2006

(54) DYNAMIC TYPE SEMICONDUCTOR MEMORY APPARATUS

(75) Inventors: Mikihiko Ito, Tokyo (JP); Masaru Koyanagi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 73 days.

(21) Appl. No.: 11/079,369

(22) Filed: Mar. 15, 2005

(65) Prior Publication Data

US 2005/0213395 A1 Sep. 29, 2005

(30) Foreign Application Priority Data

Mar. 17, 2004 (JP) ............................. 2004-076160

(51) Int. Cl.
*G11C 5/06* (2006.01)
(52) U.S. Cl. .................... 365/63; 365/149; 365/150; 365/189.05
(58) Field of Classification Search .............. 365/63, 365/189.05, 149, 150
See application file for complete search history.

(56) References Cited

U.S. PATENT DOCUMENTS 5,886,930 A * 3/1999 Maclellan et al. ..... 365/189.05

6,115,318 A * 9/2000 Keeth ......................... 365/233

FOREIGN PATENT DOCUMENTS

JP 07-282583 10/1995

* cited by examiner

*Primary Examiner*—Richard Elms
*Assistant Examiner*—Pho M. Luu
(74) *Attorney, Agent, or Firm*—Oblon, Spivak, McClelland, Maier & Neustadt, P.C.

(57) ABSTRACT

A dynamic type semiconductor memory apparatus performs an operation of continuous column access at a high speed while minimizing an increase of a chip size. The dynamic type semiconductor memory apparatus includes first and second memory cell groups divided based on a column address, a first bit line connected to the first memory cell group, a second bit line connected to the second memory cell group, first and second local data lines, and a column selection unit configured to connect the first and second bit lines to the first and second local data line based on a column address. The dynamic type semiconductor memory apparatus further includes first and second master data line, a local data line selecting unit configured to connect the first and second local data lines to the first and second master data lines, respectively, a DBR configured to read data from the first or second master data lines, and a DWB configured to write data to the first or second master data lines.

14 Claims, 10 Drawing Sheets

DYNAMIC TYPE SEMICONDUCTOR MEMORY APPARATUS

CROSS-REFERENCE TO RELATED APPLICATIONS

This application claims priority from, and the benefit of, Japanese Patent Application No. 2004-76160, filed on Mar. 17, 2004, the contents of which are expressly incorporated herein by reference in their entirety.

BACKGROUND OF THE INVENTION

A. Field of the Invention

The present invention relates to a dynamic type semiconductor memory apparatus, and more particularly, to a dynamic type semiconductor memory apparatus that performs a continuous column access operation at a higher speed than a conventional memory apparatus while restraining a chip size increase to a minimum.

B. Background of the Invention

Recently, it has been required to perform operations of a dynamic type semiconductor memory (DRAM) apparatus at a higher speed. To meet the need of a higher accessing speed of a DRAM, it has conventionally been proposed to perform a continuous access of a plurality of memory cells that are connected to one word line by changing only a column address. This method is referred to as a continuous column access operation.

In spite of the fact that the continuous column access operation is beneficial to a transfer of a large volume of data at a high speed, it is difficult to control a timing for performing a data reading operation at the high speed, immediately after a data writing operation has been completed. Since a data read buffer (DRB) and a data write buffer (DWB) are disposed in an external area of a memory cell alley, a wiring capacity of each data line connecting a bit line to both the DRB and DWB becomes much bigger than the capacity of the bit line. Consequently, it takes a longer time in order to charge the data line previous to transmit the data across the data line, which limits the speed of the memory device. This is a serious drawback for the conventional memory devices for achieving the continuous column access operation at a higher speed.

In particular, it takes a long time to pre-charge the data line for a data write operation because the data line is driven by the DWB that has a larger driving function for reversing a bit line sense amplifier through a transfer gate. Consequently, operation timings of the data lines for performing a data write operation into a memory cell through the data line and for performing a data read operation from another memory cell through the same data line become slow and difficult to control. Such a timing control of the data line becomes the most severe problem for the conventional memory devices regarding the increase in the speed transfer of data. To solve the problem of the timing control of the data line, Japanese Patent Application Publication 7-282583 (herein '583) has proposed one method for connecting two—accessing circuits and one bit line.

However, the method of '583 needs to provide two main amplifiers for each of the memory cell alleys. The main amplifier corresponding to the above-explained DRB and DWB requires a large layout area. Accordingly, the method of '583 has an inevitable drawback of a large increase of the chip size. Since a recent development of the dynamic type semiconductor memory apparatus mainly introduces a hierarchy configuration for the data lines in order to increase a capacity of the DRAM, the layout areas for the DRB and DWB are extremely increased so as to drive a master data line having a large wiring capacity. However, the industry requires memory devices having a small area, which is a problem for the above discussed memory device of the '583 reference.

Further, the method disclosed in the '583 reference cannot achieve an actual high speed operation of data access for a DRAM that has a high speed serial input/output function. To increase a bandwidth for a data transfer in such a DRAM having a high speed function, the DRAM needs to simultaneously access the data having a data size from 128 bit to 1024 bit in the memory cell unit and also needs to transmit and receive the data at a high speed to and from an external unit through a parallel/serial conversion circuit. Thus, the DRAM needs to provide the same numbers of DRB and DWB for the respective bits in order to simultaneously access the same memory cell unit. For example, the DRAM needs to increase the numbers of the DRB and DWB to at least twice the numbers of the DRB and DWB of a conventional memory device. Consequently, the conventional devices cannot achieve a high speed operation without considerably increasing the chip size.

As mentioned above, the conventional dynamic type semiconductor memory apparatus has problems in performing the high speed of continuous column access operation without increasing the chip size. Actually, such an increase of the chip size is not permissible from an industrial aspect because of the required cost performance relation for the recent DRAM.

SUMMARY OF THE INVENTION

The present invention provides a dynamic type semiconductor memory apparatus that realizes a continuous column access operation at a higher speed than a conventional device while restraining a chip size increase. According to one embodiment of the present invention, the dynamic type semiconductor memory apparatus includes: a memory cell alley including a plurality of memory cells disposed repeatedly along row and column directions; a word line configured to selectively drive the memory cell based on a row address being input from an external unit; first and second memory cell groups determined by dividing the selectively driven memory cell alley based on a column address; a first bit line configured to transmit or receive first data to and from the first memory cell group; a second bit line configured to transmit or receive second data to and from the second memory cell group; first and second local data lines disposed along the row direction adjoining the memory cell alley; a column selection unit configured to respectively connect the first and second bit lines to the first and second local data lines based on the column address; a first master data line disposed corresponding to the first local data line; a second master data line disposed corresponding to the second local data line; a local data line selecting unit configured to connect the first and second local data lines to the first and second master data lines, respectively; a data reading unit configured to read the data from the memory cell alley by selecting the first or second master data line; and a data writing unit configured to write data being input from the external unit by selecting the first or second master data line.

According to another embodiment of the present invention, a dynamic type semiconductor memory apparatus includes: a memory cell alley including a plurality of memory cells disposed repeatedly along row and column directions; a word line configured to selectively drive the memory cell alley based on a row address being input from an external unit; first and second memory cell groups determined by dividing the selectively driven memory cell alley based on a column address; a first bit line configured to transmit or receive first data to and from the first memory cell group; a second bit line configured to transmit or receive second data to and from the second memory cell group; a column address selection line decoding unit configured to output first and second column selection signals based on first and second column decode selection signals being activated in a predetermined order and the column address; first to fourth local data lines disposed along the row direction adjoining the memory cell alley; a first column selection unit configured to respectively connect the first and second bit lines to the first and second local data lines based on the first column selection signal; a second column selection unit configured to respectively connect the first and second bit lines to the third and fourth local data lines based on the second column selection signal; a first master data line disposed corresponding to the first and second local data lines; a second master data line disposed corresponding to the third and fourth local data lines; a local data line selecting unit configured to connect the first and second local data lines to the first master data line and to connect the third and fourth local data lines to the second master data line; a data reading unit configured to read data from the memory cell alley by selecting the first and second master data lines; and a data writing unit configured to write the data being input from the external unit by selecting the first or second master data lines, where the data reading unit and the data writing unit select the first master data line when the first column decode selection signal is activated, and select the second master data line when the second column decode selection signal is activated.

Further features, aspects, and advantages of the present invention will become apparent from the detailed description of embodiments that follows, when considered together with the accompanying figures of the drawings.

BRIEF DESCRIPTION OF THE DRAWINGS

The accompanying drawings, which are incorporated in and constitute part of this specification, illustrate various embodiments and/or features of the present invention, and together with the description, serve to explain the present invention. Where possible, the same reference number will be used throughout the drawings to describe the same or like parts. In the drawings.

DESCRIPTION OF THE EMBODIMENTS

Figure 1:
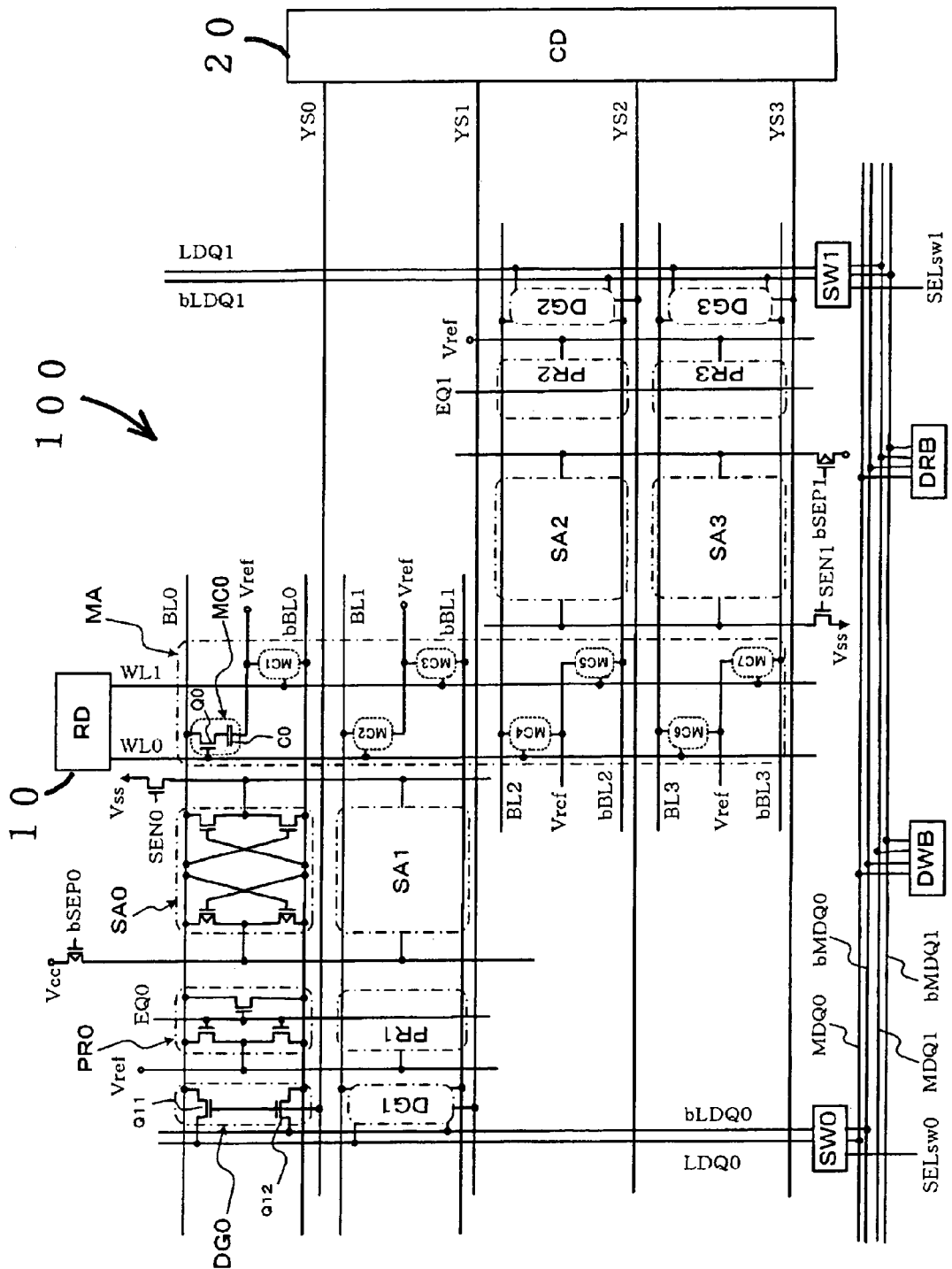
FIG. 1 is a block diagram illustrating a dynamic type semiconductor memory apparatus according to one embodiment of the present invention.

Reference will now be made in detail to the exemplary embodiments of the present invention, examples of which are illustrated in the accompanying drawings. Hereinafter, to simplify the explanation, a pair of complementary data lines or signal lines is simply referred to as "a data line pair" or "a signal pair." FIG. 1 shows an exemplary block diagram of a dynamic type semiconductor memory apparatus according to an embodiment of the present invention. FIG. 1 illustrates a memory array cell and data access relating portions of the memory array cell.

For purposes of explanation only, as an example, FIG. 1 shows two word lines WL0 and WL1, eight bit lines BL0–BL3 and bBL0–bBL3, eight memory cells MC0–MC7 that are coupled to the two word lines WL0 and WL1, four local data lines LDQ0, LDQ1, bLDQ0 and bLDQ1, and four master data lines MDQ0, MDQ1, bMDQ0 and bMDQ1. In the following description, a memory cell alley is referred to as a "MA," a memory cell is referred to as a "MC," a word line is referred to as a "WL," a bit line is referred to as a "BL" and a complementary bit line of the BL is referred to as a "bBL," a local data line is referred to as a "LDQ" and a complementary local data line of LDQ is referred to as a "bLDQ," and a master data line is referred to as a "MDQ" and a complementary master data line is referred to as a "bMDQ."

An actual dynamic type semiconductor memory apparatus, for example, includes 512 word lines, 4,096 bit lines, 1 mega (M) memory cells that are coupled to the 512 word lines and 4,096 bit lines, and 16 local data lines are provided for each of memory cell alley. Master data lines are commonly shared by a plurality of memory cell alleys and each local data line is coupled through switch gates so as to form a hierarchical configuration.

As illustrated in FIG. 1, according to an embodiment of the present invention, a dynamic type semiconductor memory apparatus 100 includes a memory cell alley (MA), a row address decoder (RD) 10 for the MA, four bit line sense amplifiers SA0–SA3 for the MA, four bit line equalizers PR0–PR3, four column selection gates DG0–DG3, a column address decoder (CD) 20, two local data line selection gates SW0 and SW1, a data write buffer (DWB) and a data read buffer (DRB).

In the MA, the eight memory cells MC0–MC7 are arranged along row and column directions. The row address decoder RD 10 is configured to selectively activate both the word lines WL0 and WL1, or either one of the WL0 or WL1 in a row direction, i.e., in a longitudinal direction in FIG. 1. The bit line sense amplifiers SA0–SA3 are configured to read the cell data by amplifying a voltage difference that is generated between a bit line pair by selectively driving four of the bit line pairs provided along a column direction, i.e., a lateral direction in FIG. 1, for inputting/outputting data among the memory cells MC0–MC7. The bit line equalizers PR0–PR3 are configured to pre-charge each of the bit line pairs. The column selection gates DG0–DG3 connect between a bit line pair and a local data line pair. The CD 20 activates exclusively one of the four column selecting gates DG0–DG3. Each of the local data line selecting gates SW0 and SW1 is configured to couple between each of the local data line pairs and each of the master data line pairs. The data write buffer DWB writes data to either one of two pairs of master data lines. The data read buffer DRB reads data from either one of the two of the master data line pairs.

As explained above, it is understood that each of two bit lines of a bit line pair reaches a complementary signal level at a data access time. A complementary bit line pair is represented, for example, by "BL0/bBL0." Similarly, "LDQ0/bLDQ0" and "MDQ0/bMDQ0" represent a complementary local data line pair and a complementary master data line pair, respectively.

The memory cell MC0 includes a cell capacitor C0 for memorizing the data and a cell transistor Q0 for controlling input/output of the cell data. One terminal of the memory cell C0 is connected to a reference voltage Vref that is equal to a bit line pre-charge voltage. The other terminal of the C0 is connected to a source terminal of the cell transistor Q0. A gate terminal of the Q0 is connected to the word line WL0, and a drain terminal of the Q0 is connected to the bit line BL0.

Each of the memory cells MC1–MC7 has a similar structure as the memory cell MC0, except that a gate terminal of each memory cells MC1, MC3, MC5 and MC7 is connected to the word line WL1, a drain terminal of the memory cell MC1 is connected to the bit line bBL0, a drain terminal of the memory cell MC2 is connected to the bit line BL1, a drain terminal of the memory cell MC3 is connected to the bit line bBL1, a drain terminal of the memory cell MC4 is connected to the bit line BL2, a drain terminal of the memory cell MC5 is connected to the bit line bBL2, a drain terminal of the memory cell MC6 is connected to the bit line BL3 and a drain terminal of the memory cell MC7 is connected to the bit line bBL3.

As illustrated in FIG. 1, the sense amplifier SA0 includes a pair of p-type MOS-FET (PMOS) and n-type MOS-FET (NMOS) transistors that are connected to the bit line pairs BL0/bBL0. The PMOS sense amplifier is activated by a bit line sense amplifier activation signal bSEP0. The NMOS sense amplifier is activated by a bit line sense amplifier activation signal SEN0. In FIG. 1, Vcc represents the voltage of a power source and Vss represents the ground voltage, which is the reference voltage.

Each of the sense amplifiers SA1–SA3 is constructed similar to the sense amplifier SA0, except the sense amplifier SA1 is connected to the bit line pair BL1/bBL1, the sense amplifier SA2 is connected to the bit line pair BL2/bBL2, the sense amplifier SA3 is connected to the bit line pair BL3/bBL3 and the sense amplifiers SA2 and SA3 are activated by bit line sense amplifier activating signals bSEP1 and SEN1.

A bit line equalizer PR0 includes the bit line pair BL0/bBL0 and three switching transistors that are connected to the reference voltage Vref for supplying the bit line pre-charge voltage. A bit line equalizing signal EQ0 is supplied to each gate terminal of the three switching transistors. Each of the bit line equalizers PR1–PR3 is similar to the bit line equalizer PR0, except the bit line equalizer PR1 is connected to the bit line pair BL1/bBL1, the bit line equalizer PR2 is connected to the bit line pair BL2/bBL2 and the bit line equalizer PR3 is connected to the bit line pair BL3/bBL3. Further, a bit line equalizing signal EQ1 is supplied to each gate terminal of the bit line equalizers PR2 and PR3.

The column selection gate DG0 includes the bit line BL0, a column selection transistor Q11 connected to the local data line LDQ0 and a column selection transistor Q12 connecting the bit line bBL0 and the local data line bLDQ0. Each gate terminal of the transistor Q11 and Q12 is connected to a column address selection line YS0 that is selectively driven by the column address decoder CD. The column selection gates DG1–DG3 are similar to DG0, except the column selection gate DG1 connects the pair of bit lines BL1/bBL1 and the local data line pair LDQ0/bLDQ0, the column selection gate DG2 connects the pair of bit lines BL2/bBL2 and the local data line pair LDQ2/bLDQ2, and the column selection gate DG3 connects the pair of bit lines BL3/bBL3 and the local data line pair LDQ1/bLDQ1. Further, a gate terminal of the column selection gate DG1 is connected to the column address selection line YS1, a gate terminal of the column selection gate DG2 is connected to the column address selection line YS2, and a gate terminal of the column selection gate DG3 is connected to the column address selection line YS3.

Similar to the column selection gate DG0, the local data line selection gate SW0 includes a switching transistor that connects to the local data line LDQ0 and to the master data line MDQ0, and also connects to the local data line bLDQ0 and the master data line bMDQ0. These switching transistors are controlled by a local data line selection signal SELsw0. Similarly, the local data line selection gate SW1 connects between the local data line pair LDQ1/bLDQ1 and the master data line pair MDQ1/bMDQ1 and the gate SW1 is controlled by the local data line selection signal SELsw1.

The data writing buffer DWB and the data reading buffer DRB have respectively six data input/output nodes. Each first and second data input/output nodes is connected to the master data line pair MDQ0/bMDQ0, each third and fourth data input/output nodes is connected to the master data line pair MDQ1/bMDQ1 and each fifth and sixth data input/output nodes is connected to a global data line pair GDQ/bGDQ (not shown in FIG. 1).

The data writing buffer DWB selectively outputs write data that is received from the global data line pair GDQ/bGDQ to the master data line pairs MDQ0/bMDQ0 or MDQ1/bMDQ1 in accordance with the master data line selection signals DQSW0 and DQSW1 that are generated based on a selected column address. Similarly, the data writing buffer DRB outputs read data that is selectively received from the master data line pairs MDQ0/bMDQ0 or MDQ1/bMDQ1 to the global data line pair GDQ/bGDQ in accordance with the master data line selection signals DQSW0 and DQSW1.

Figure 2:
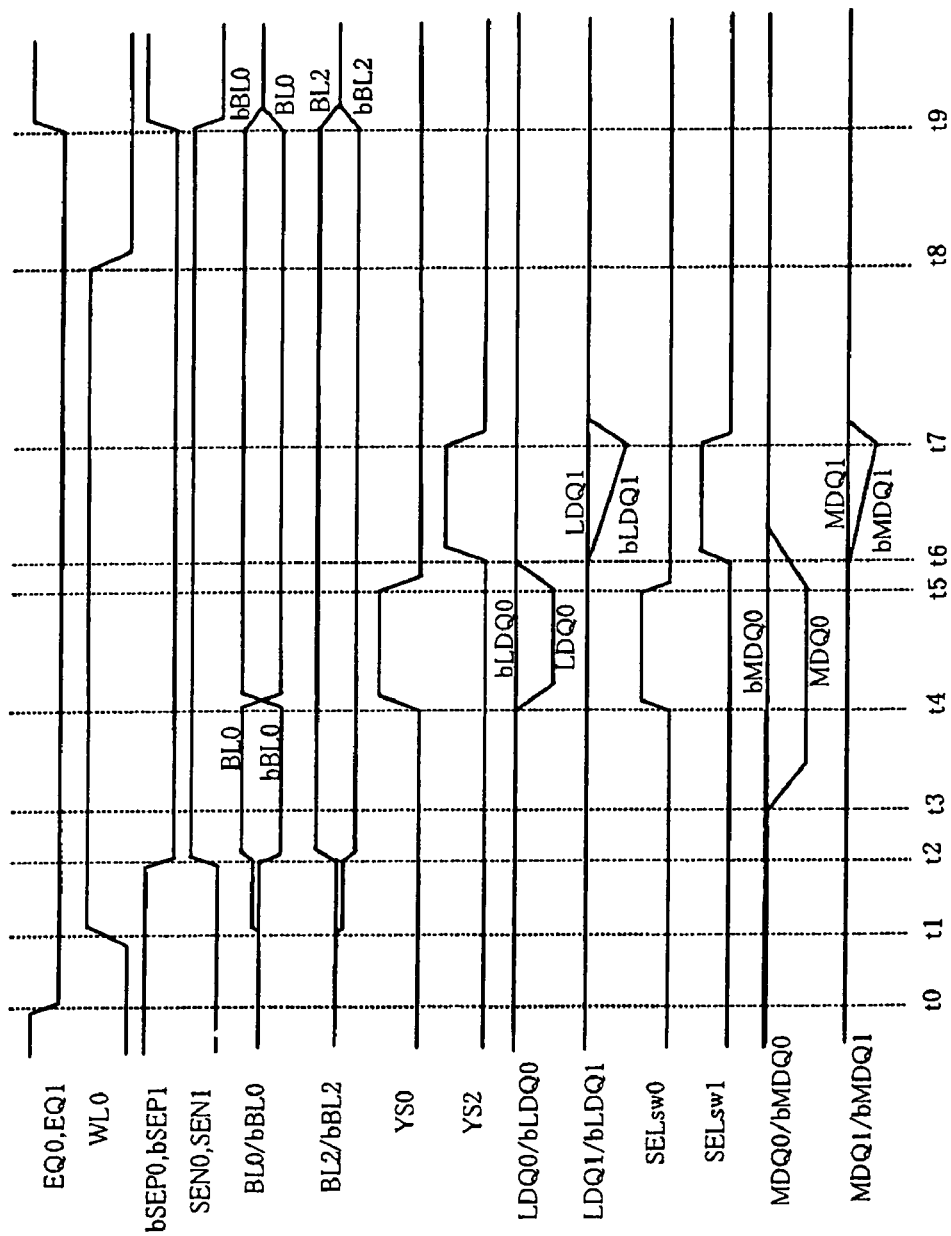
FIG. 2 illustrates waveforms explaining continuous column access operations of the dynamic type semiconductor memory apparatus according to the embodiment of the present invention shown in FIG. 1.

Regarding FIG. 2, a continuous column access operation will be explained according to one embodiment of the present invention. FIG. 2 shows an example in which data is written to the memory cell MC0 and immediately after the writing, the data is read out from the memory cell MC4.

To write data into the memory cell MC0, each memory cell MC0, MC2, MC4 and MC6 performs a read operation. Thus, at a time t0, an internal control circuit (not shown) of the apparatus turns the bit line equalizers PR0–PR3 to an "off" status by changing the bit line equalizing signals EQ0 and EQ1 from the "H" level to the "L" level. At a later time t1, the cell data in each memory cell MC0, MC2, MC4 and MC6 is read to the bit lines BL0–BL3 by changing the word line WL0 from the "L" level to the "H" level. Further, at a time t2, the bit line sense amplifier activation signals bSEP0 and bSEP1 are changed from the "H" level to the "L" level, and the bit line sense amplifier activation signals SEN0 and SEN1 are changed from the "L" level to the "H" level. The read cell data of the bit lines BL0–BL3 is amplified by the activating the sense amplifiers SA0–SA3.

After performing the reading operation, the new data is written to the memory cell MC0. Thus, the write data inputted from an external unit of the apparatus is taken into an input buffer (not shown) and is transferred to the data write buffer DWB. At a time t3, an internal control circuit outputs the write data to the master data line pair MDQ0/bMDQ0 by operating the data write buffer DWB. At this time, the master data line pair MDQ0/bMDQ0 is, as illustrated in FIG. 2, complementary changed to the "H" or "L" levels in accordance to the write data. Further, at a time t4, the master data line pair MDQ0/bMDQ0 and the local data line pair LDQ0/bLDQ0 change to the "on" status by changing the line selection signal SELsw0 to the "H" level.

At the same time, the column address selection line YS0 changes to the "H" level by being selectively driven in accordance to the column address CD and both the pair of local data lines LDQ0/bLDQ0 and the pair of bit lines BL0/bBL0 acquire the "on" status. In this way, the write data is written to the memory cell MC0 by the data write buffer DWB through the master data line pair MDQ0/bMDQ0, the local data line pair LDQ0/bLDQ0 and the bit line pair BL0/bBL0.

Subsequent to the writing operation to the memory cell MC0, the data in the memory cell MC4 is read. Thus, at a time t5 when the writing operation to the memory cell MC0 has been performed within the internal control circuit, the column address decoder CD is controlled such that the column address selection line YS0 changes to the "L" level. At this time, because the memory cells MC0 and MC4 are selectively driven by the same word line WL0, the word line WL0 holds the "H" level and the sense amplifiers SA0–SA3 also maintain the read status acquired the first time.

At a time t6, the column address selection line YS2 changes to the level "H" by being selectively driven by the column address decoder CD and the bit line pair BL2/bBL2 and the local data line pair LDQ1/bLDQ1 change to the "on" status. Simultaneously, the internal control circuit changes the line selection signal SELsw1 to the "H" level, and changes the master data line pair MDQ1/bMDQ1 and the local data line pair LDQ1/bLDQ1 to the "on" status. Accordingly, the data read from the memory cell MC4 is stored into the data read buffer DRB through the bit line pair BL2/bBL2, the local data line pair LDQ1/bLDQ1 and the master data line pair MDQ1/bMDQ1.

Figure 3:
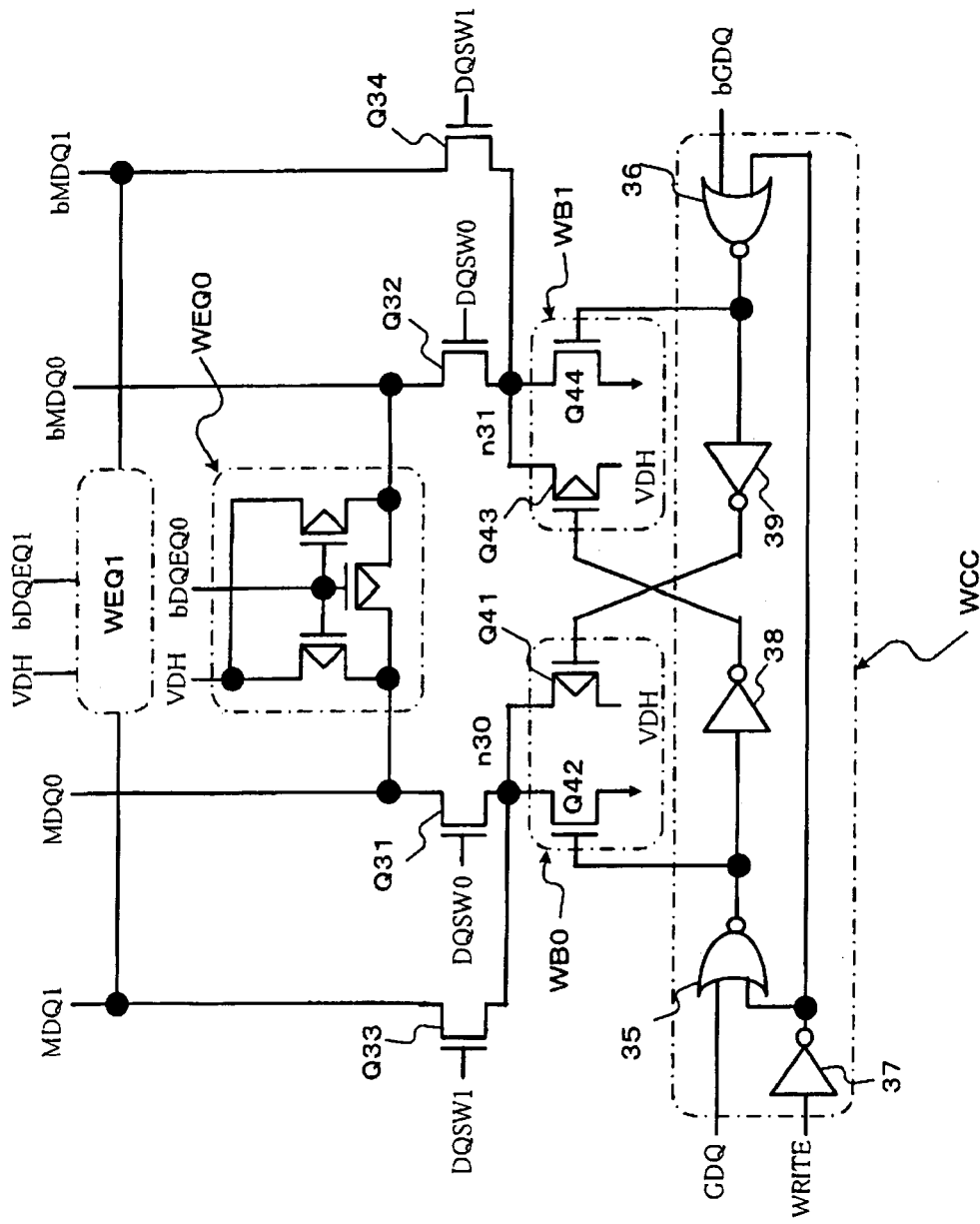
FIG. 3 is a circuit block diagram illustrating a data write buffer of the dynamic type semiconductor memory apparatus according to the embodiment of the present invention shown in FIG. 1.

FIG. 3 shows a circuit diagram illustrating an exemplary data write buffer DWB of the dynamic type semiconductor memory apparatus according to another embodiment of the present invention. The dynamic type semiconductor memory apparatus includes the data write buffer DWB, two write equalizers WEQ0 and WEQ1 configured to pre-charge the pair of master data lines MDQ0/bMDQ0 that are connected to first and second data input/output nodes and the pair of master data lines MDQ1/bMDQ1 that are connected to third and fourth data input/output nodes having the "H" level of the data line pre-charge voltage VDH. Further, the memory apparatus includes four master data line selection transistors Q31–Q34 configured to select a pair of master data lines MDQ0/bMDQ0 or MDQ1/bMDQ1, two write buffers WB0 and WB1 configured to output write data to a pair of master data lines MDQ0/bMDQ0 or MDQ1/bMDQ1 through the master data line selection transistors Q31–Q34, and a write control circuit WCC configured to receive write data from the global data line pair GDQ/bGDQ that is connected to fifth and sixth data input/output nodes and to transfer the write data to the two write buffers WB0 and WB1.

As illustrated in FIG. 3, the write equalizing circuit WEQ0 includes three switching transistors that are connected to the master data line pair MDQ0/bMDQ0 and the data line pre-charge voltage VDH. A data line equalizing signal bDQEQ0 is supplied to each gate terminal of the three switching transistors. The write equalizing circuit WEQ1 is similar to the write equalizing circuit WEQ0, except the write equalizing circuit WEQ1 is connected to the pair of master data lines MDQ1/bMDQ1, and the data line equalizing signal bDQEQ1 is supplied to a gate terminal of the write equalizing circuit WEQ1.

A master data line selection signal DQSW0 is supplied to a gate terminal of the master data line selection transistor Q31, a drain terminal of the transistor Q31 is connected to the master data line MDQ0 and a source terminal of the transistor Q31 is connected to an output node n30 of the write buffer WB0. The data line selection signal DQSW0 is input to a gate terminal of the master data line selection transistor Q32, the master data line bMDQ0 is connected to a drain terminal of the Q32 and a source terminal of the Q32 is connected to a node n31 of an output of the write buffer WB0.

A master data line selection signal DQSW1 is input to a gate terminal of the master data line selection transistor Q33, and a drain terminal of the Q33 is connected to the master data line MDQ1. A source terminal of the Q33 is connected to the node n30, a gate terminal of the master data line selection transistor Q34 is input to the master data line selection signal DQSW1, and a drain terminal of the Q34 is connected to the master data line bMDQ1. A source terminal of the Q34 is connected to the node n31.

The write buffer WB0 includes a pair of a PMOS transistor Q41 and a NMOS transistor Q42. A source terminal of the PMOS transistor Q41 is connected to the data line pre-charge voltage VDH. A drain terminal of the Q42 is connected to the node n30 and a drain terminal of the NMOS transistor Q42 is connected to the node n30. A source terminal of the Q42 is connected to the ground voltage Vss. The write buffer WB1 is similar to the write buffer WB0 except that the drain terminals of the PMOS transistor Q43 and the NMOS transistor Q44 in the WB1 are connected to the node n31.

As illustrated in FIG. 3, the write control circuit WCC includes two NOR circuits NOR 35 and NOR 36 and the WCC has three input nodes and four output nodes. The first input node of the write control circuit WCC is connected to an input of an inverter INV 37, and an output of the inverter INV 37 is connected to each one of the inputs for the NOR circuits NOR 35 and NOR 36. The other input of the NOR circuit NOR 35 is connected to a second input of the write control circuit WCC, and the other input of the NOR 36 is connected to a third input node of the write control circuit WCC.

An output of the NOR 35 is connected to a first output node of the write control circuit WCC and an input of an INV 38. An output of the INV 38 is connected to a second output node of the write control circuit WCC. An output of the NOR 36 is connected to a third output node of the write control circuit WCC and an input of an INV 39. An output of the INV 39 is connected to a fourth output node of the write control circuit WCC.

A write control signal WRITE is supplied to the first input node of the write control circuit WCC. The second input node of the WCC is connected to the global data line GDQ, and the third input node of the WCC is connected to the global data line bGDQ. The first output node of the WCC is connected to the gate terminal of the MOS transistor Q42, and the second output node of the WCC is connected to the gate terminal of the PMOS transistor Q43. The third output node of the WCC is connected to the gate terminal of the NMOS transistor Q44 and the fourth output node of the WCC is connected to the gate terminal of the PMOS transistor Q41.

According to the configuration shown in FIG. 3, the data write buffer DWB selectively writes data that has been received through the global data line pair GDQ/bGDQ to the master data line pair MDQ0/bMDQ0 or the master data line pair MDQ1/bMDQ1 in synchronism with the write control signal WRITE.

Figure 4:
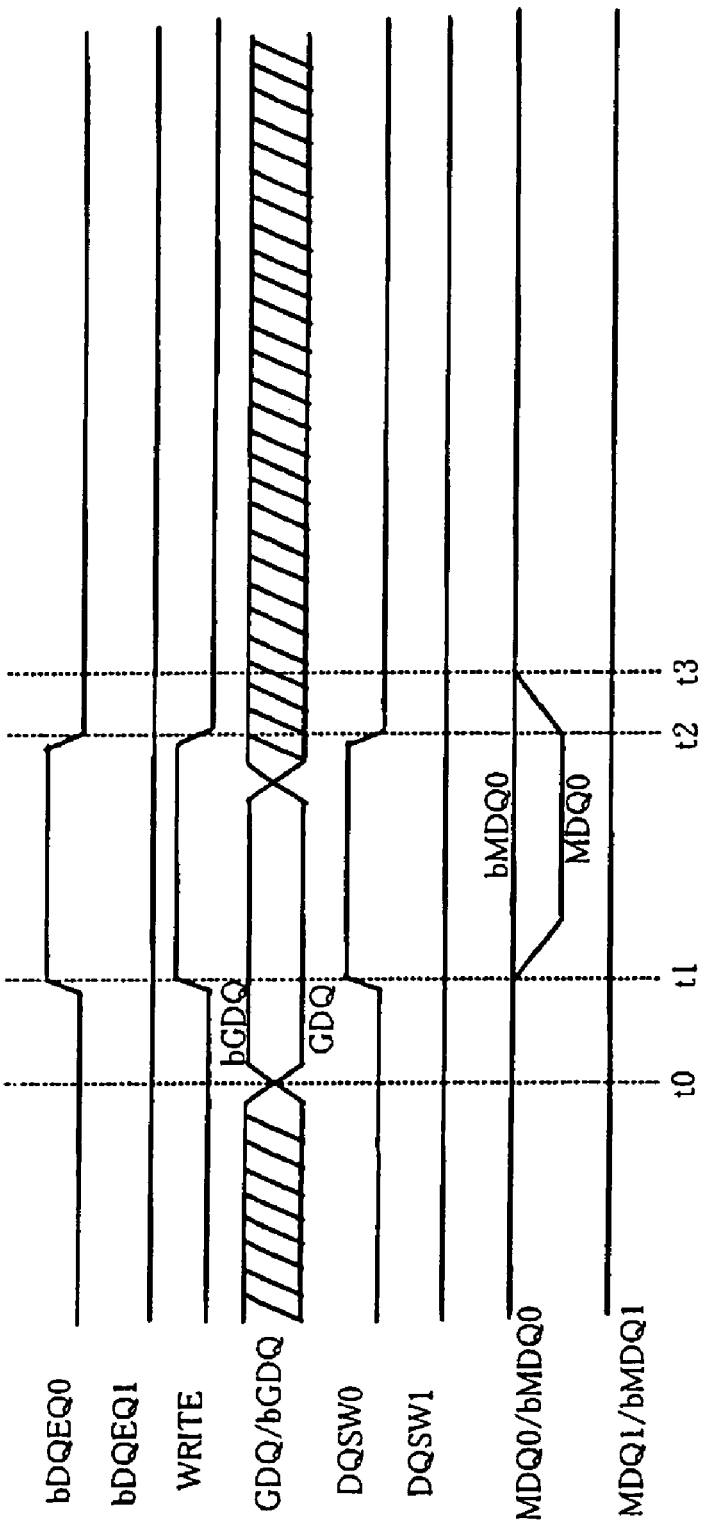
FIG. 4 illustrates waveforms showing a write operation to a data line of the data write buffer of the dynamic type semiconductor memory apparatus according to the embodiment of the present invention shown in FIG. 1.

FIG. 4 illustrates a writing operation to a data line of the data write buffer DWB of a dynamic type semiconductor memory apparatus according to another embodiment of the present invention. For an explanation purpose only, the exemplary case shown in FIG. 4 outputs the write data from the global data line pair GDQ/bGDQ to a master data line pair. For instance, the data writing operation has not yet commenced at a time t0. Before such a time t0, the pair of data line equalizing signals bDEQ0 and bDEQ1 changes to the "L" level, and then the write equalizing circuits WEQ0 and WEQ1 start to operate. At this time, the master data line pair MDQ0/bMDQ0 and the master data line pair MDQ1/bMDQ1 are pre-charged with the data line pre-charge voltage VDH.

At a next time t1, the write control signal WRITE changes to the "H" level in accordance with the internal control circuit. Then, the data write buffer DWB starts the write operation to the master data line pair MDQ0/bMDQ0. Accordingly, the internal control circuit turns the data line equalizing signal bDQEQ0 to the "H" level and the write equalizing circuit WEQ0 changes to the "off" status. At the same time, the internal control circuit turns the master data line selection signal DQSW0 to have the "H" level, and the master data line selection transistors Q31 and Q32 are turned on in order to select the master data line pair MDQ0/bMDQ0.

At this time, as illustrated in FIG. 4, if the global data line GDQ changes to the "L" level and the global data line bGDQ changes to the "H" level, the NMOS transistor Q42 turns on and the PMOS transistor Q41 turns off. Thus, the master data line MDQ0 is connected to the Vss through the master data line selection transistor Q31. Similarly, the PMOS transistor Q43 turns on and the NMOS transistor Q44 turns off. Thus, the master data line bMDQ0 is connected to the line pre-charge voltage VDH through the master data line selection transistor Q32. In this way, the DWB transfers the write data received from the global data line pair GDQ/bGDQ to the master data line pair MDQ0/bMDQ0.

At a following time t2, the signal WRITE is changed to the "L" level by the internal control circuit and the data write buffer DWB stops the writing operation to the master data line pair MDQ0/bMDQ0. Thus, both outputs of the NOR circuits NOR 35 and NOR 36 turn to the "L" level, and all the transistors Q41–Q44 are turned off. Simultaneously, the internal control circuit changes the master data line selection signal DQSW0 to the "L" level and stops the master data line pair MDQ0/bMDQ0. Further, the internal control circuit changes the master data line equalizing signal bDQEQ0 to the "L" level and starts pre-charging the master data line pair MDQ0/bMDQ0 with the write equalizing circuit WEQ1.

Because the wiring capacity of the master data line pair MDQ0/bMDQ0 has a large volume, it takes a long time, up to a time t3 before the pair of the master data lines MDQ0/bMDQ0 are pre-charged so as to perform a following data access. During this write operating period, it becomes possible to enter a next data access, because the master data line pair MDQ1/bMDQ1 holds the previous charging status.

Similar to the writing operation shown in FIG. 4, the data write operation can be performed on the master data line pair MDQ1/bMDQ1 with a difference that the internal control circuit changes the data line equalizing signal bDQEQ1 to the "L" level, and turns off the write equalizing circuit WEQ1. Further, the internal control circuit changes the master data line selection signal DQSW1 to the "H" level and turns on the master data line selection transistors Q33 and Q34 in order to control and select the master data line pair MDQ1/bMDQ1. The selection of the master data line pair MDQ0/bMDQ0 and the selection of one of either MDQ1 or bMDQ1 is controlled as explained in the following.

At a first access, a selected master data line is preliminarily designated. At a second access, the master data line is controlled so as to automatically be changed. At a third access, the master data line that is selected at the first access is controlled so as to be selected. Then, the master data line pair MDQ0/bMDQ0 and the master data line pair MDQ1/bMDQ1 are controlled so as to be alternately selected until the power source of the apparatus is shut down or the internal control circuit is reset. For instance, if the master data line pair MDQ0/bMDQ0 is designated to be selected at the first access, the master data line pair MDQ1/bMDQ1 is selected at the second access, and the master data line pair MDQ0/bMDQ0 is selected at the third access.

Figure 5:
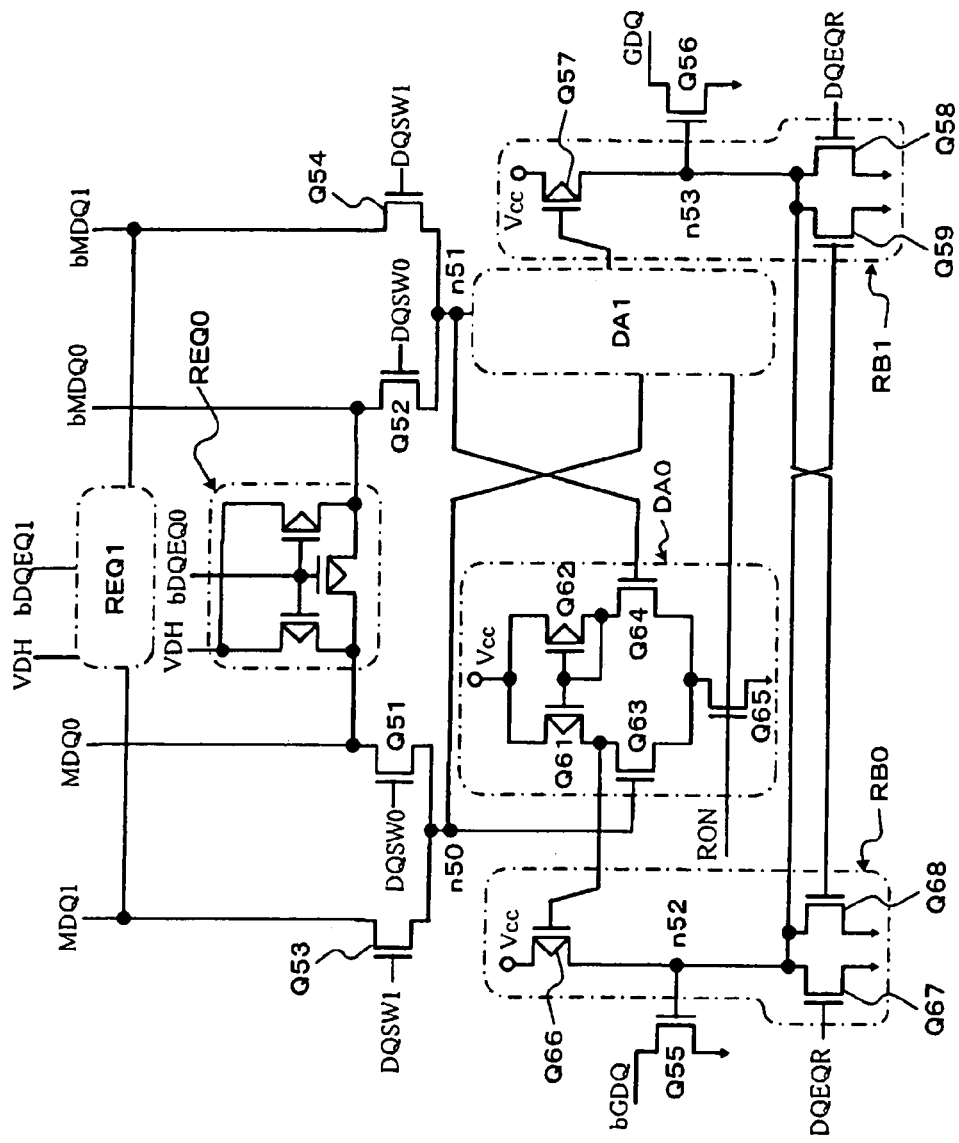
FIG. 5 is a block diagram illustrating a data read buffer applied in the dynamic type semiconductor memory apparatus according to the embodiment of the present invention shown in FIG. 1.

FIG. 5 illustrates a circuit block diagram of the data read buffer DBR used in the dynamic type semiconductor memory apparatus according to one embodiment of the present invention. The data read buffer DBR includes two read equalizers REQ0 and REQ1, four master data line selection transistors Q51–Q54, two data sense amplifiers DA0 and DA1, two read buffers RB0 and RB1 and global data line driving transistors Q55 and Q56. Each of the read equalizers REQ0 and REQ1 performs a pre-charging of the master data line pair MDQ0/bMDQ0 that is connected to first and second data input/output nodes and the pair of master data lines MDQ1/bMDQ1 that are connected to third and fourth data input/output nodes. Each of the master data line selection transistors Q51–Q54 selects the master data line pair MDQ0/bMDQ0 or the master data line pair MDQ1/bMDQ1. The data sense amplifiers DA0 and DA1 receive and latch the data read from the data sense amplifiers DA0 and DA1. The global data line driving transistors Q55 and Q56 output the read data to fifth and sixth data input/output nodes.

The read equalizer REQ0 includes three switching transistors that are connected to the MDQ0/bMDQ0 and to the pre-charge voltage VDH. The data line equalizing signal bDQEQ0 is inputted to each gate terminal of the switching transistors. The read equalizer REQ1 is similar to the REQ0 except that REQ1 is connected to the master data line pair MDQ1/bMDQ1, and the data line equalizing signal bDQEQ1 is inputted to a gate terminal of the REQ1.

The master data line selection signal DQSW0 is inputted to a gate terminal of the master data line selection transistor Q51, a drain terminal of the Q51 is connected to the master data line MDQ0, and a source terminal of the Q51 is connected to the input node n50 of the data sense amplifiers DA0 and DA1. The master data line selection signal DQSW0 is inputted to the gate terminal of the selection transistor Q52, a drain terminal of the Q52 is connected to the master data line bMDQ0, and a source terminal of the Q52 is connected to the input node n51. The master data line selection signal DQSW1 is inputted to the gate terminal of the master data line selection transistor Q53, and a drain terminal of the Q53 is connected to the master data line MDQ1. A source terminal of the Q53 is connected to the node n50, the master data line selection signal DQSW1 is inputted to a gate terminal of the master data line selection transistor Q54, a drain terminal of the Q54 is connected to the master data line bMDQ1, and a source terminal of the Q54 is connected to the node n51.

As illustrated in FIG. 5, the data sense amplifier DA0 is configured as a current miller type operational amplifier that includes two PMOS transistors Q61 and Q62 and two NMOS transistors Q63 and Q64. The NMOS transistor Q65 is connected between the DA0 and the ground voltage Vss. The DA0 is activated by a data sense amplifier activating signal RON inputted to a gate terminal of the NMOS transistor Q65. A first operational input of the data sense amplifier DA0 is connected to the node n50, and a second operational input is connected to the node n51. An output of the DA0 is supplied to the read buffer RB0.

The data sense amplifier DA1 is similar to the data sense amplifier DA0, except that a first operational input of the DA1 is connected to the node n51, and a second operational input of the DA1 is connected to the node n50. An output of the DA1 is supplied to a read buffer. According to such a configuration, the outputs from the data sense amplifiers DA0 and DA1 form a complementary data pair.

The read buffer RB0 shown in FIG. 5 includes one PMOS transistor Q66 and two NMOS transistors Q67 and Q68. Each drain terminal of the transistors Q66–Q68 is connected to an output node n52 of the read buffer RB0. A source terminal of the PMOS transistor Q66 is connected to a power source having a voltage Vcc, and a gate terminal of the Q66 is connected to an output of the data sense amplifier DA0. A source terminal of the NMOS transistor Q67 is connected to the ground voltage Vss, and a reading control signal DQEQR is inputted to a gate terminal of the Q67. A source terminal of the NMOS transistor Q68 is connected to the ground voltage Vss, and a gate terminal of the Q68 is connected to an output node n53 of the read buffer RB1.

The read buffer RB1 is similar to the read buffer RB0 except that a gate terminal of the PMOS transistor of the RB1 is connected to an output of the data sense amplifier DA1, and a gate terminal of one of the NMOS transistors is connected to the output node n52 of the read buffer RB0. According to such a configuration, the read buffers RB0 and RB1 may latch the data received from the sense amplifiers DA0 and DA1 as a complementary data pair.

The global data line driving transistor Q55 may be an open drain output driving transistor, for transferring an output from the read buffer RB0 to the global data line bGDQ. A drain terminal of the Q55 is connected to the global data line bGDQ, a gate terminal of the Q55 is connected to the node n52 and a source terminal of the Q55 is connected to the ground voltage Vss. Similarly, a drain terminal of the transistor Q56 is connected to the global data line GDQ, a gate terminal of the Q56 is connected to a node n53 and a source terminal of the Q56 is connected to the ground voltage Vss.

According to the above mentioned configuration, the data read buffer DRB amplifies read and latched data that are selectively received from the master data line pairs MDQ0/bMDQ0 or MDQ1/bMDQ1 while synchronizing with the data sense amplifier activating signal RON and outputs the read data to the global data line pair GDQ/bGDQ.

Figure 6:
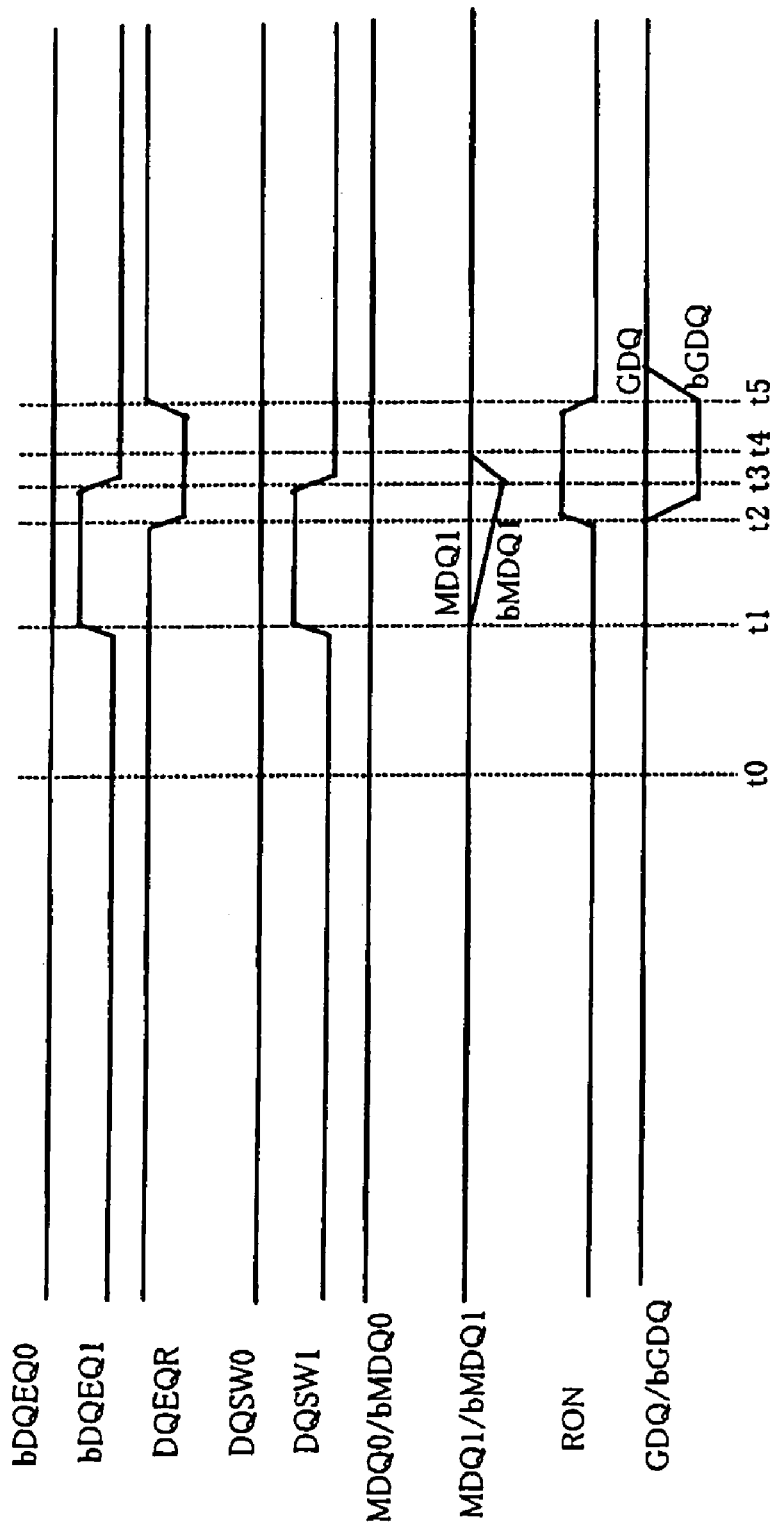
FIG. 6 illustrates waveforms explaining read operation from the data read buffer of the dynamic type semiconductor memory apparatus according to the embodiment of the present invention shown in FIG. 1.

FIG. 6 illustrates the reading operations of the data read buffer DRB from a data line. In this example, the DRB reads the data from the master data line pair MDQ1/bMDQ1 and outputs the data to the global data line pair GDQ/bGDQ.

As shown in FIG. 6, the data reading operation has not yet commenced at a time t0. Before this time, data equalizing signals bDQEQ0 and bDQEQ1 change to the "L" level, and because the read equalizing circuits REQ0 and REQ1 are operating, both the master data line pairs MDQ0/bMDQ0 and MDQ1/bMDQ1 are pre-charged up to the data line pre-charge voltage VDH. Further, at this time, the signal DQEQR has the "H" level and the NMOSs Q67 and Q58 transistors are turned on in order to definitely hold the global data line driving transistors Q55 and Q56 in an "off" status to prevent the global data line pair GDQ/bGDQ changing to the "L" level.

At a next time t1, the data line equalizing signal bDQEQ1 is turned to the "H" level by an internal control circuit when the master data line selection signal DQSW1 changes to the "H" level, and the data read buffer DRB starts the reading operation from the master data line pair MDQ1/bMDQ1. Thus, the master data line selection transistors Q53 and Q54 turn on and the master data line pair MDQ1/bMDQ1 is respectively connected to the data sense amplifiers DA0 and DA1. Then, the data read from the memory cell array is gradually transferred to the nodes n50 and n51 through the master data line pair MDQ1/bMDQ1.

The read data are amplified at the bit line sense amplifiers SA0–SA3 depicted in FIG. 1. In accordance to the amplification of the amplifiers SA0–SA3, the outputting side of the master data line pair MDQ1/bMDQ1 gradually reduces its voltage. Further, because the wiring capacity of the master data line pair MDQ1/bMDQ1 is large, a large time will elapse until a time t2, in order to generate a voltage difference so as to perform the amplification at the data sense amplifiers DA0 and DA1.

At the time t2 when the data is read to the master data line pair MDQ1/bMDQ1, the internal control circuit changes the signal DQEQR to the "L" level and turns off the NMOS transistors Q67 and Q58. At the same time, the data sense amplifier activation signal RON is turned to the "H" level and the data sense amplifiers DA0 and DA1 are operating. At this time, as shown in FIG. 6, if the master data line MDQ1 is at the "H" level and the master data line bMDQ1 changes to the "L" level, the NMOS Q63 in the data sense amplifier DA0 turns on, and an output from the differential amplifier changes to the "L" level. Further, the PMOS Q66 in the read buffer RB0 is turned on. Also, the node n52 changes to the "H" level, and global data selection driving transistor Q55 turns on. Accordingly, the global data line bGDQ is connected to the ground potential Vss and changes to the "L" level. Further, since the node n52 changes to the "H" level, the NMOS Q59 turns on. Thus, the global data selection driving transistor Q56 holds an "off" status, and the global data line GDQ also holds the "H" level.

When the output operation to the global data line pair GDQ/bGDQ has been completed, the internal control circuit prepares a next reading operation by returning the data read buffer DRB to the pre-charge status. Thus, at a time t3, the internal control circuit changes the master data line selection signal DQSW1 to the "L" level and stops to select the master data line pair MDQ1/bMDQ1. Simultaneously, the internal control circuit changes the data line equalizing signal bDQEQ1 to the "L" level and pre-charges the master data line pair MDQ1/bMDQ1 to the data line pre-charge voltage VDH. For the same reason discussed above regarding the data write buffer DWB, the internal control circuit needs a long time (until a time t4) for performing the pre-charge.

As explained above, the read buffers RB0 and RB1 form a latch circuit. Accordingly, as long as the signal DQEQR does not change to the "H" level, the outputs to the global data line pair GDQ/bGDQ are maintained, even if the data sense amplifiers DA0 and DA1 enter a non-activation status by changing the data sense amplifier activating signal RON to the "L" level.

When the output from the data read buffer DRB to the global data line pair GDQ/bGDQ is stopped, at a time t5 when the master data line pair MDQ1/bMDQ1 has been sufficiently pre-charged, the internal control circuit changes the data sense amplifier activating signal RON to the "L" level and stops the operations of the data sense amplifiers DA0 and DA1. At the same time, the internal control circuit changes the signal DQEQR to the "H" level and turns off the global data line driving transistors Q55 and Q56 by turning on the NMOS Q67 and Q58.

During this reading operation period, the master data line pair MDQ0/bMDQ0 that is not used to read, holds the pre-charge status so as to immediately enter a next data access. Similarly, the data read operation from the master data line pair MDQ0/bMDQ0 is performed as explained in FIG. 6, except that the internal control circuit changes the data line equalizing signal bDQEQ0 to the "L" level, and the read equalizing circuit REQ0 is turned off. Further, the data read operation is controlled so as to select the master data line pair MDQ0/bMDQ0 by changing the master data line selection signal DQEQ0 to the "H" level and also by turning on the master data line selection transistors Q51 and Q52.

Similar to the data write buffer DWB, either one of the master data line pairs MDQ0/bMDQ0 and MDQ1/bMDQ1 is alternately selected. Even when the write operation and the read operation are successively accessed, similar to the above explanation, the master data line pair MDQ0/bMDQ0 and the master data line pair MDQ1/bMDQ1 are alternately used for every access to the memory array MA by selecting the pairs despite of the data writing or data reading.

As explained above, a dynamic type semiconductor apparatus according to one embodiment of the present invention includes two master data line pairs. Thus, a first master data line pair is used during a first write operation and a second master data line pair is used during a next reading operation. Further, the second master data line pair is pre-charged during a time when the first master data line pair is used. Consequently, the first master data line pair is pre-charged during a time when the second master data line pair is used. By following this approach, the pre-charging time of the master data line pairs does not prevent the dynamic type semiconductor apparatus from continuously accessing data, thus becoming possible to perform a continuous column access operation at a high speed without slowing down the memory device due to the charging of the data lines.

According to one embodiment of the present invention, one memory cell alley MA is provided with two master data line pairs MDQ0/bMDQ0 and MDQ1/bMDQ1 and one data read buffer DBR and one data write buffer DWB are commonly used by the master data lines. Consequently, the dynamic type semiconductor memory apparatus of this embodiment performs a continuous column access operation at a higher speed than a conventional memory apparatus while restraining a chip size increase to a minimum. In the above-explained embodiment, in consideration of the pre-charge time, each of the write equalizing circuit WEQ0 and the read equalizing circuit REQ0 and each of the write equalizing circuit WEQ1 and the read equalizing circuit REQ1 are respectively provided for each of the data write buffer DWB and the data read buffer DRB. Alternatively, it is possible to commonly use the write equalizing circuit WEQ0 and the read equalizing circuit REQ0 and also to commonly use the write equalizing circuit WEQ1 and the read equalizing circuit REQ1.

Figure 7:
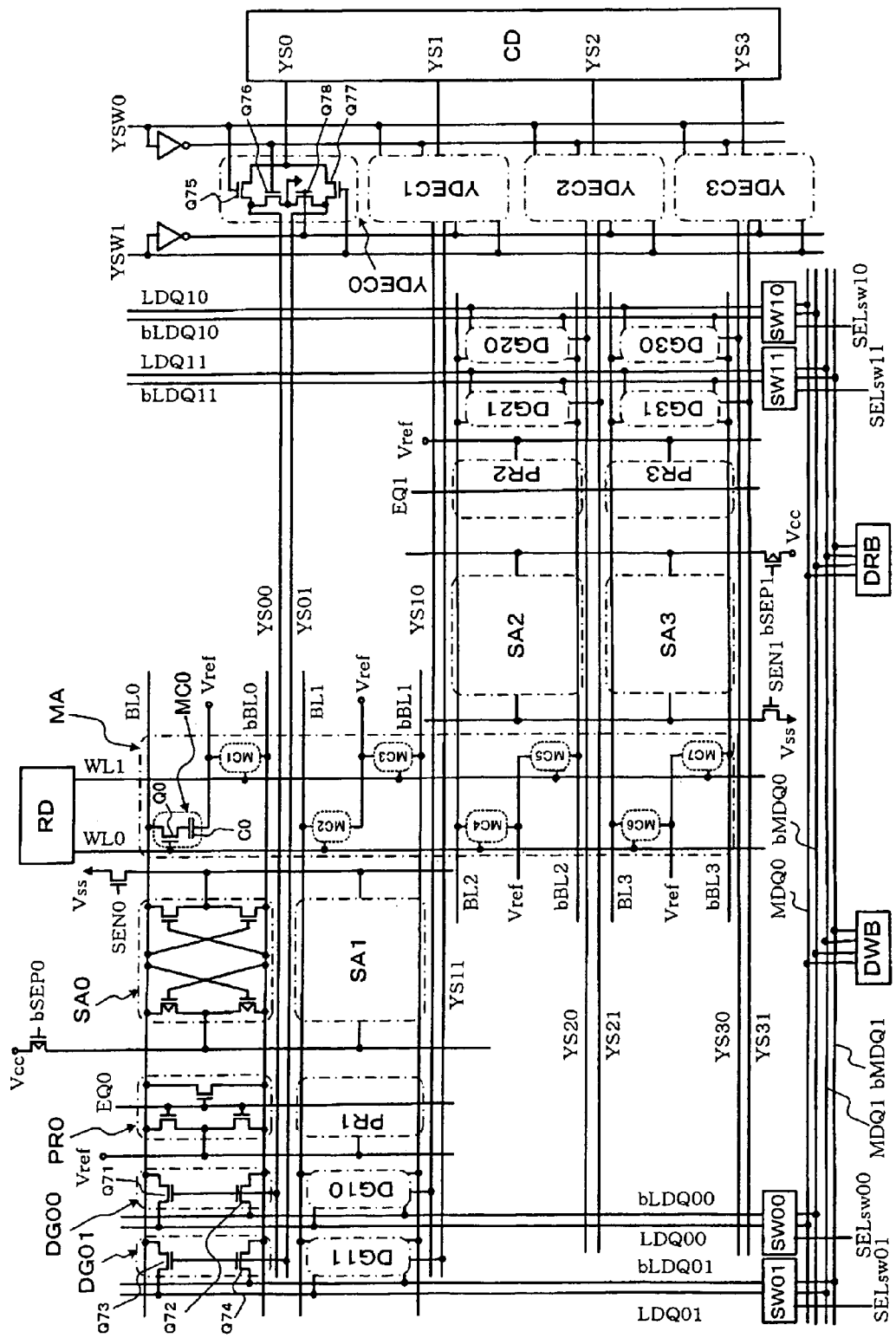
FIG. 7 is a block diagram illustrating a dynamic type semiconductor memory apparatus according to another embodiment of the present invention.

FIG. 7 illustrates a dynamic type semiconductor memory apparatus according to another embodiment of the present invention. Similar to FIG. 1, FIG. 7 shows only one memory array and portions relating to data access operations of the memory array. In this embodiment, two local data line pairs are connected to one pair of bit lines, which is different from the memory device of FIG. 1. According to the above-explained embodiment, the memory apparatus practically is not delayed by the pre-charge time for the master data line pair and achieves a high speed operation of continuous column access by providing two master data line pairs. If a plurality of memory cells that commonly uses a local data line pair is successively accessed, for example when the data is written to the memory cell MC0 and data is read from the memory cell MC2, it is further necessary to consider a pre-charge time for the local data line pair, because the wiring capacity of the local data line pair is relatively small comparative to the master data line pair. Accordingly, it becomes difficult for the memory apparatus to continuously operate because of the pre-charging of the local data line pair.

To solve such a problem, in a dynamic type semiconductor memory apparatus according to another embodiment of the present invention, two local data line pairs are provided to practically not delay the operation of the memory apparatus by the pre-charge time for the local data line pair in order to achieve a continuous column access operation at a high speed. The dynamic type semiconductor memory apparatus of this embodiment includes a memory array MA in which a plurality of memory cells MC0–MC7 are provided in a plurality of row directions and a plurality of column directions, word lines WL0 and WL1 are configured to selectively drive the memory cells MC0–MC7 in the row direction, a row address decoder RD is configured to selectively activate the WL0 or WL1, four pairs of bit lines are provided to input and output data in the column direction among the memory cells MC0–MC7, bit line sense amplifiers SA0–SA3 are configured to read cell data by amplifying a voltage difference generated between a bit line pair after selectively driving the word line WL0 or WL1, bit line equalizing circuits PR0–PR3 are configured to change the bit line pair to a pre-charge status, four pairs of eight column selection gates DG00–DG31 are provided for respectively connecting between one pair of the bit lines and two pairs of the local data lines, a column address decoder CD is configured to select one pair from the DG00–DG31, four column address select line decode circuits YDEC0–YDEC3 are configured to exclusively activate either one of the pair column selection gates selected by the column address decoder CD, four local data line selection gates SW00–SW11 are connected between the local data line pair and the master data line pair, a data write buffer DWB is configured to write the data to either one of the two master data line pairs, and a read data read buffer DRB is configured to read the data from either one of the two master data line pairs.

A pair of bit lines, a local data line pair and a master data line pair in the present embodiment are similar to those used in the above embodiment. In FIG. 7, the column selection gates DG00–DG31, the column address selection line decode circuits YDEC0–YDEC3 and the local data line selection gates SW00–SW11 are similar to those of FIG. 1. Further, the decoded column address selection lines YS00–YS31, the column decode selection signals YSW0, YSW1 and the local data line selection signals SELsw00–SELsw11 are similar as explained regarding FIG. 1. For simplicity, the explanation for the same circuit blocks and the same control signals is omitted herein.

The column selection gate DG00 includes a column selection transistor Q71 connected between the bit line BL0 and the local data line LDQ, and a column selection transistor Q72 connected between the bit line bBL0 and the local data line bLDQ00. Each gate terminal of the Q71 and Q72 is connected to the decoded column address selection line YS00 that is selectively driven by the column address selection line decode circuit YDEC0. The column selection gate GD01 includes a column selection transistor Q73 connected between the bit line BL0 and the local data line LDQ01 and a column selection transistor Q74 that connects the bit line bBL0 and the local data line bLDQ01. Each gate terminal of the Q73 and Q74 is connected to a decoded column address selection line YS01 that is selectively driven by the column address selection line decode circuit YDEC0.

The column selection gates DG10, DG20 and DG30 are similar to the column selection gate DG00, except that the DG10 connects to the bit line pair BL1/bBL1 and the local data line pair LDQ00/bLDQ00, the DG20 connects to the bit line pair BL2/bBL2 and the local data line pair LDQ10/bLDQ10, and the DG30 connects to the bit line pair BL3/bBL3 and the local data line pair LDQ10/bLDQ10. Further, a gate terminal of the column selection gate DG10 is connected to a decoded column address selection line YS10, a gate terminal of the DG20 is connected to the decoded column address selection line YS20, and a gate terminal of the column selection gate DG30 is connected to the decoded column address selection line YS30.

The column selection gates DG11, DG21 and DG31 are similar to the column selection gate DG01, except that DG11 connects to the bit line pair BL1/bBL1 and the local data line pair LDQ01/bLDQ01, the column selection gate DG21 connects to the bit line pair BL2/bBL2 and the local data line pair LDQ11/bLDQ11, and the column selection gate DG31 connects to the bit line pair BL3/bBL3 and the local data line pair LDQ11/bLDQ11. Further, a gate terminal of the gate DG11 is connected to the decoded column address selection line YS11, a gate terminal of the column selection gate DG21 is connected to the decoded column address selection line YS21, and a gate terminal of the DG31 is connected to the decoded column address selection line YS3.

Similar to the column selection gate DG00, the local data line selection gate SW00 includes two switch transistors that connect between the local data line LDQ0 and the master data line MDQ0, and also connect between the local data line bLDQ00 and the master data line bMDQ0. The switch transistors are controlled by the local data line selection signal SELsw00. The local data line selection gates SW01–SW11 are similar to the local data line selection gate SW00, except that SW01 connects between the local data line pair LDQ1/bLDQ1 and the master data line pair MDQ1/bMDQ1, the SW10 connects between the local data line pair LDQ10/bLDQ1 and the master data line pair MDQ 10/bMDQ10, and the SW11 connects between the local data line pair LDQ11/bLDQ11 and the master data line pair MDQ 1/bMDQ1. The SW01 is connected through the local data line selection signal SELsw 01, the SW10 is connected through the local data line selection signal SELsw10, and the SW11 is connected through the local data line selection signal SELsw11.

As illustrated in FIG. 7, the circuit YDEC0 includes four NMOSs Q75–Q78, and has four control nodes, one input node and two output nodes. A gate terminal of the NMOS Q75 is connected to the first control node of the YDEC0, a drain terminal of the Q75 is connected to the input node of the YDEC0, and a source terminal of the Q75 is connected to the first output node of the YDEC0. A gate terminal of the NMOS Q76 is connected to the second control node of the YDEC0, a drain terminal of the Q76 is connected to the first output node of the YDEC0, and a source terminal of the Q76 is connected to the ground potential voltage Vss.

A gate terminal of the NMOS Q77 is connected to the third control node of the YDEC0, a drain terminal of the Q77 is connected to the input node of the YDEC0, and a source terminal of the Q77 is connected to the second output node of the YDEC0. A gate terminal of the NMOS Q76 is connected to the second control node of the YDEC0, a drain terminal of the Q76 is connected to the first output node of the YDEC0, and a source terminal of the Q76 is connected to the ground potential voltage Vss. A gate terminal of the NMOS Q78 is connected to the fourth control node of the YDEC0, a drain terminal of the Q78 is connected to the second output node of the YDEC0, and a source terminal of the Q78 is connected to the ground potential voltage Vss.

A column decode selection signal YSW0 is inputted to a first control node of circuit the YDEC0, and a reversed signal of the YSW0 signal is inputted to the second control node. A column decode selection signal YSW1 is inputted to the third control node of the YDEC0, and a reversed signal of the YSW1 control is inputted to the fourth control node. The input node of the circuit YDEC0 is connected to the column address selection signal YS0 from the column address decoder CD. The first output node is connected to a post-decoded column address selection line YS00, and the second output node is connected to a post-decoded column address selection line YS01.

By such a configuration, the circuit YDEC0 exclusively activates the post-decoded column address selection lines YS00 or YS01 based on the column decode selection signals YSW0 and YSW1 when the column address selection signal YS0 is selectively activated by the column address decoder CD. Thus, when the column decode selection signal YSW0 changes to the "H" level, the post-decoded column address selection line YS00 is activated so that it connects between the bit line pair BL0/bBL0 and the local line pair LDQ00/bLDQ00. If the column decode selection signal YSW1 changes to the "H" level, the post-decoded column address selection line YS01 is activated so as to connect between the bit line pair BL0/bBL0 and the local line pair LDQ01/bLDQ01.

The column address selection line decode circuits YDEC1 to YDEC3 are similar to the YDEC0. However, YDEC1 is different from the YDEC0 in that an input node of the YDEC1 is connected to the column address selection line YS1. A first output node of the circuit YDEC1 is connected to the post-decoded column address selection line YS10, and a second output node of the circuit YDEC1 is connected to the post-decoded column address selection line YS11. An input node of the circuit YDEC2 is connected to the column address selection line YS2, a first output node of the circuit YDEC2 is connected to the post-decoded column address selection line YS20, and a second output node of the circuit YDEC2 is connected to the post-decoded column address selection line YS21. An input node of the circuit YDEC3 is connected to the column address selection signal YS3, a first output node of the circuit YDEC3 is connected to the post-decoded column address selection line YS31, and a second output node of the circuit YDEC3 is connected to the post-decoded column address selection line YS31.

Figure 8:
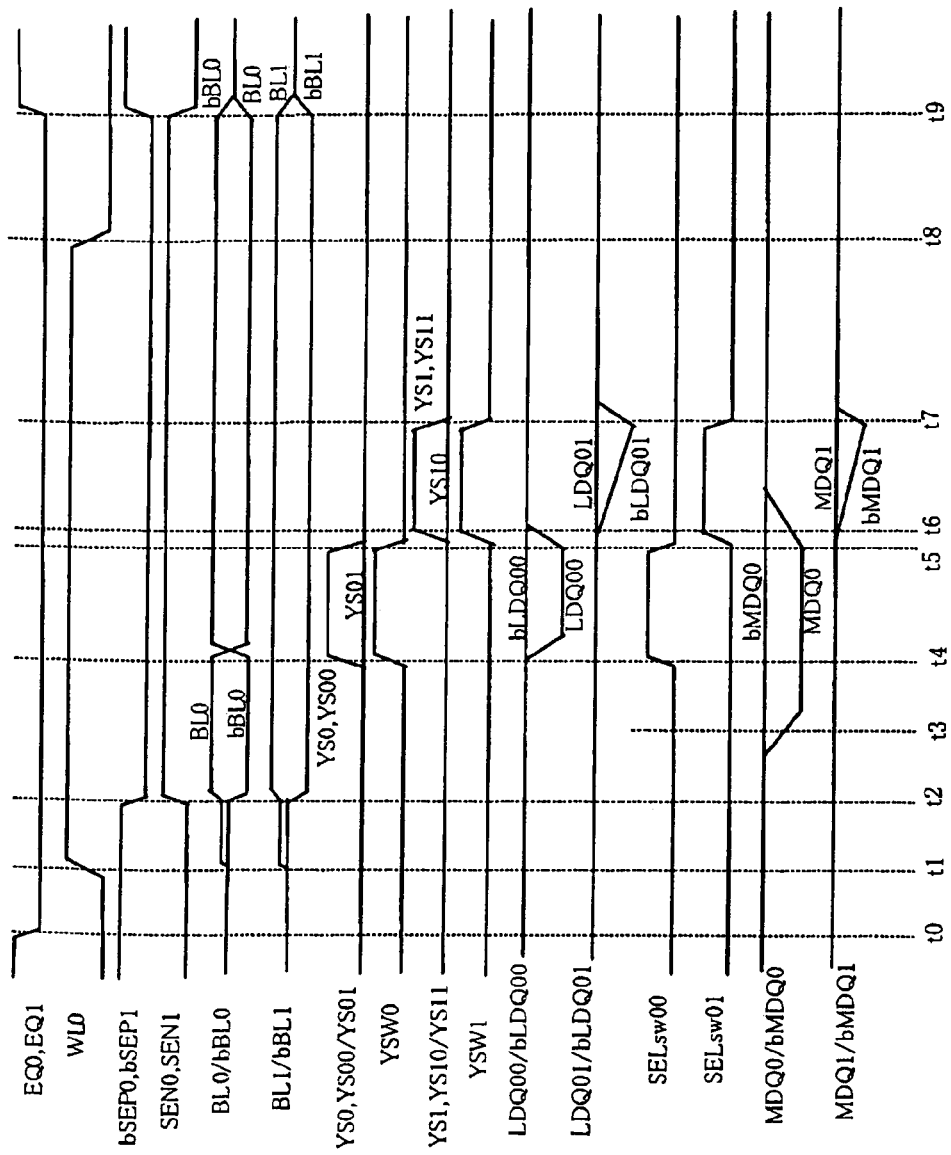
FIG. 8 illustrates waveforms explaining continuous column access operations of the dynamic type semiconductor memory apparatus according to the embodiment of the present invention shown in FIG. 7.

FIG. 8 show waveforms for explaining the continuous column access operations of the dynamic type semiconductor memory apparatus according to the embodiment illustrated in FIG. 7. In a non-limiting example, a continuous column access operation by two memory cells that are selectively driven by the word line WL0 is illustrated in FIG. 8. Thus, the data is written to the memory cell MC0 and immediately after writing, the data is read from the memory cell MC2.

In FIG. 8, the operation of the data write buffer DWB is continued until the data is written into the master data line pair MDQ0/bMDQ0 at a time t3 which has been explained regarding FIG. 2. At a succeeding time t4, the internal control circuit selects which local data line pair LDQ00/bLDQ00 or LDQ01/bLDQ01 may be connected to the MDQ0/bMDQ0. Such a selection and connection is controlled in a same manner as the control of the master data line pairs MDQ0/bMDQ0 and MDQ1/bMDQ1 explained in the previous embodiment. Thus, the local data line pair corresponds to the master data line pair that is selected by the internal control circuit. In FIG. 8, at a time when the data is written to the memory cell MC0, the local data line pair LDQ00/bLDQ00 is selected and at a time when the data is read from the memory cell MC2, the local data line pair LDQ01/bLDQ01 is selected.

Accordingly, at a time t4, the master data line pair MDQ0/bMDQ0 and the local data line pair LDQ00/bLDQ00 are changed to the "on" status by the local data line selection gate SW00, and the local data line LDQ00 is changed to the "L" level by the data write buffer DWB. At the same time, the column address selection line YS0 is selected by the column address decoder CD, and the post-decoded column address selection line YS00 is activated by the column address selection decode circuit YDEC0. Consequently, the column selection gate DG00 turns on, and the local data line pair LDQ00/bLDQ00 and the bit line pair BL0/bBL0 change to the "on" status. In this way, the write data is written into the memory cell MC0 by the data write buffer DWB through the master data line pair MDQ0/bMDQ0, the local data line pair LDQ00/bLDQ00 and the bit line pair BL0/bBL0.

Subsequent to the write operation into the memory cell MC0, the data is read from the memory cell MC2. Thus, at time t5 when the write operation into the memory cell MC0 is performed, the internal control circuit changes the column address selection line YS0 to the "L" level. When the column address selection line YS0 changes to the "L" level, the post-decoded column address selection line YS00 also is changed to the "L" level by the column address selection line decode circuit YDEC0. Consequently, the column selection gate DG00 turns off, and the bit line pair BL0/bBL0 and the local data line pair LDQ00/bLDQ00 have a non-connection status. At this time, because the memory cells MC0 and MC2 are selectively driven by the same word line WL0, WL0 holds the "H" level and the bit line sense amplifiers SA0–SA3 maintain the reading status.

At a time t6 when the column address selection line YS1 changes to the "H" level, the post-decoded column address selection line YS11 is changed to the "H" level by the column address selection line decode circuit YDEC1. Consequently, the column selection gate DG11 turns on, and the bit line pair BL1/bBL1 and the local data line pair LDQ01/bLDQ01 change to the "on" status. At the same time, the internal control circuit changes the local data line selection signal SELsw01 to the "H" level and turns the local data line selection gate SW01 on, and changes both the master data line pair MDQ1/bKDQ1 and the local data line pair LDQ01/bLDQ01 to the "on" status. Thus, the data read from the memory cell MC2 is transmitted to the data read buffer DRB through the bit line pair BL1/bBL1, and the local data line pairs LDQ01/bLDQ01 and MDQ1/bMDQ1.

The present embodiment is different from the previous embodiment, in that it becomes possible for the column address selection line YS1 and the column decode selection signal YSW1 to change to the "H" level at a time t6 immediately after the time t5 when the column address selection line YS0 changes to the "L" level. According to the previous embodiment, the memory apparatus starts a read operation after the local data line pair LDQ0/bLDQ0 is pre-charged in order to prevent an error of the data reading. According to this embodiment, because the two local data line pairs LDQ00/bLDQ00 and LDQ01/bLDQ01 are respectively connected to the bit line pairs BL0/bBL0 and BL1/bBL1, it is possible to omit an apparent pre-charging time and also it is possible to connect between the local data line pair LDQ01/bLDQ01 and the bit line pair BL1/bBL1 without waiting for the pre-charging of the local data line pair LDQ00/bLDQ00.

Thus, the dynamic type semiconductor memory apparatus of this embodiment realizes a continuous column access operation at a higher speed by continuously operating during a pre-charging time of the local data line pair due to the inclusion of two local data line pairs. In this embodiment, the column address selection line decoding circuits YDEC0–YDEC3 include four NMOS, but another numbers of NMOS can be used.

Figure 9:
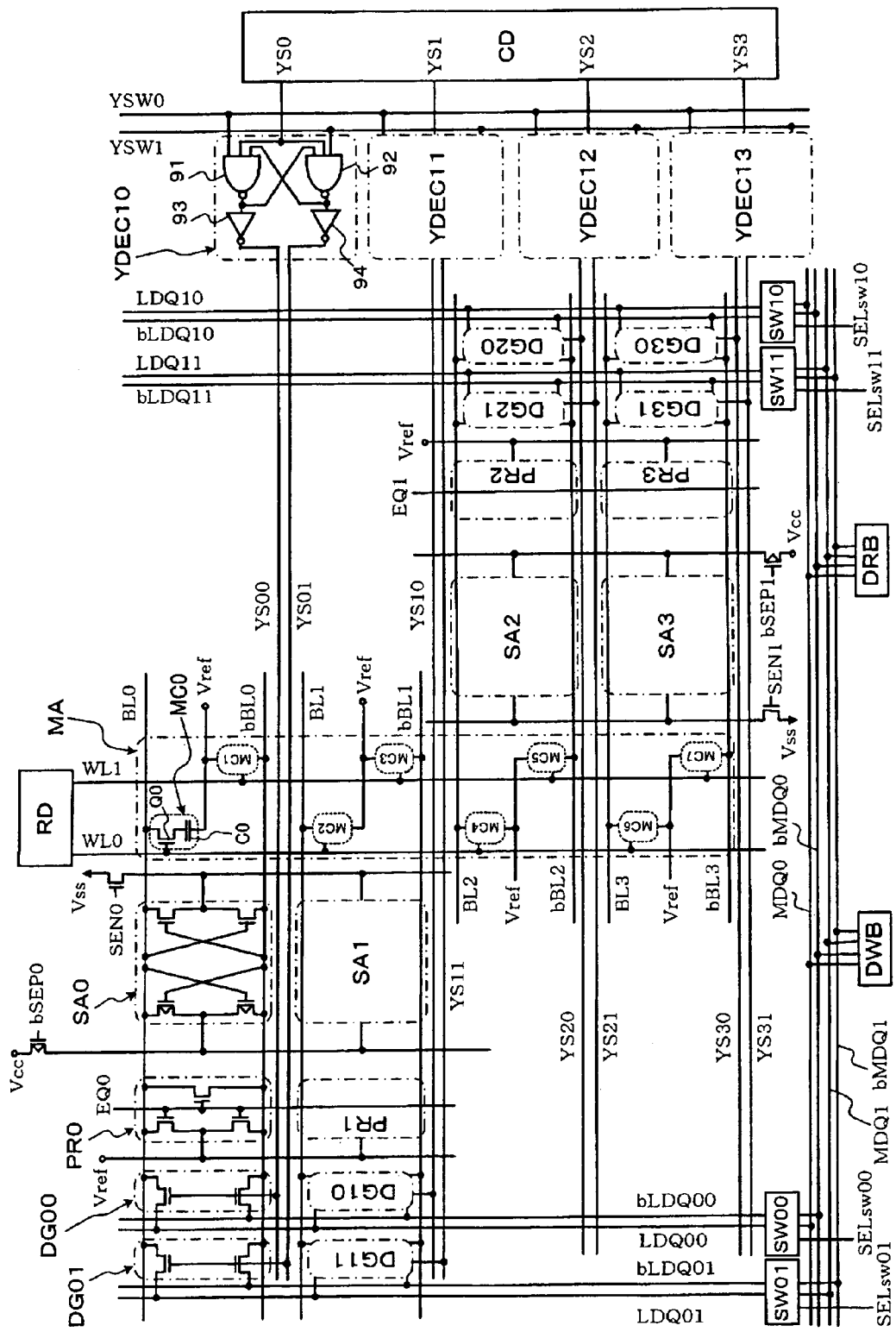
FIG. 9 is a block diagram illustrating a dynamic type semiconductor memory apparatus according to yet another embodiment of the present invention.

FIG. 9 is a block diagram illustrating a dynamic type semiconductor memory apparatus according to another embodiment of the present invention. Similar to FIG. 1, FIG. 9 shows one memory array MA and data access relating portions of the memory array. The memory apparatus of this embodiment has a column address selection line decode circuit that includes a latching function different from the above discussed embodiments. The previous embodiment achieves a higher continuous column access operation by providing two local data line pairs. Even though two local data line pairs are provided, it is difficult to start the data reading from the memory cell MC2 until sufficiently maintaining a writing time to the memory cell MC0, because the address selection line decode circuits YDEC0–YDEC3 include NMOSs.

To achieve a higher continuous column access operation of the memory apparatus, according to the present embodiment, the column address selection line decode circuit has the latching function. Having the latching function, an apparent time for writing data into the memory cell is shorten by overlapping the data writing and the data reading operation during the continuous column access operation.

A dynamic type semiconductor memory apparatus according to this embodiment is shown in FIG. 9 and includes memory cells MC0–MC7, a memory array MA disposed along row and column directions, word lines WL0 and WL1 for selectively driving the memory cells MC0–MC7 in the row direction, a row address decoder RD configured to select and activate the WL0 or WL1, four bit line pairs provided along the column direction to input and/or output data among the memory cells MC0–MC7, read bit line sense amplifiers SA0–SA3 configured to read the cell data by amplifying the voltage difference generated between a pair of bit lines due to selectively driving the word line WL0 or WL1, bit line equalizing circuits PR0–PR3 configured to set a bit line pair in a pre-charging status, a column address decoder CD configured to select one pair among four pairs of eight column selection gates DG00–DG31, each connected between one bit line pair and two local data line pairs, four column address selection line decoding circuits YDEC10–YDEC13 configured to exclusively activate either one of a pair of column selection gate selected by the CD, four local data line selection gates SW00–SW11 configured to be connected between the local data line pair and the master data line pair, a data write buffer DWB configured to write the data into either one of the two master data line pairs, and a data read buffer DRB configured to read the data from either one of the two master data line pairs.

In the apparatus of FIG. 9, the bit line pair, the local data line pair and the master data line pair are similar to those shown in FIG. 1. In FIG. 9, with the exception of the address selection line decode circuits YDEC0–YDEC3, the circuit configuration, operations and connections of the elements of the memory apparatus are the same as explained in FIG. 7.

As shown in FIG. 9, the column address selection line decode circuit YDEC10 includes two NAND circuits NAND 91 and 92 and two inverters INV 93 and 94. Each of the two NAND circuits NAND 91 and 92 has three inputs. The column address selection line decode circuit YDEC10 includes two control nodes, one input node and two output nodes. A first input of the NAND 91 is connected to a first control node of the YDEC10, and a second input of the NAND 91 is connected to an input node of the YDEC10. A third input of the NAND 91 is connected to an output of the NAND 92, and an output of the NAND 91 is connected to an input of the INV 93.

A first input of the NAND 92 is connected to a second control node of the YDEC10, a second input of the NAND 92 is connected to an input node of the YDEC10, and a third input of the NAND 92 is connected to an output of the NAND 91 and an output the NAND 92 is connected to an input of the inverter INV 94. An output of the INV 93 is connected to a first output node of the YDEC10 and an output of the INV 94 is connected to a second output node of the YDEC10. A column decode selection signal YSW0 is supplied to the first control node of the address selection line decode circuit YDEC10, and a column decode selection signal YSW1 is supplied to the second control node of the YDEC10. The input node of the YDEC10 is connected to the column address selection line YS0, and the first output node of the YDEC10 is connected to the decoded column address selection line YS00. The second output node of the YDEC10 is connected to the decoded column address selection line YS01.

According to the above discussed configurations of the memory apparatus, if the column address selection line YS0 is selected and activated by the column address decoder CD, the address selection line decode circuit YDEC10 exclusively selects and activates the decoded column address selection line YS00 or YS01 based on the column decode selection signals YSW0 and YSW1. Thus, if the column decode selection signal YSW0 is "H", the decoded column address selection line YS00 changes to the "H" level so as to connect between the bit line pair BL0/bBL0 and the local data line pair LDQ00/bLDQ00, and if the YSW1 is at the "H" level, the decoded column address selection line YS01 changes to the "H" level so as to connect to the bit line pair BL0/bBL0 and the local data line pair LDQ01/bLDQ01.

The address selection line decode circuits YDEC11–YDEC13 are also configured similar to the address selection line decode circuit YDEC10, except that an input node of the address selection line decode circuit YDEC11 is connected to the column address selection line YS1, and the first output node of the YDEC11 is connected to the decoded column address selection line YS10. Further, the second output node of the YDEC11 is connected to the decoded column address selection line YS11, an input nod of the address selection line decode circuit YDEC12 is connected to the column address selection line YS2, and the first output node of the YDEC12 is connected to the decoded column address selection line YS20. The second output node of the YDEC12 is connected to the decoded column address selection line YS21, and an input node of the YDEC13 is connected to the column address selection line YS3. The first output node of the YDEC13 is connected to the decoded column address selection line YS30, and the second output node of the YDEC13 is connected to the decoded column address selection line YS31.

According to such configurations of the address selection line decode circuits YDEC10–YDEC13, it becomes possible to overlap connections between two bit line pairs and the local data line pair. For instance, immediately after a time when the data write operation starts by setting the decoded column address selection line YS00 to the "H" level, it becomes possible to perform the data read operation from the memory cell MC2 by setting the decoded column address selection line YS11 to the "H" level. Consequently, it becomes possible to achieve a read operation at a higher speed, because the operation of the memory apparatus is not delayed by a waiting time of the decoded column address selection lines YS00 when changing to the "L" level.

Figure 10:
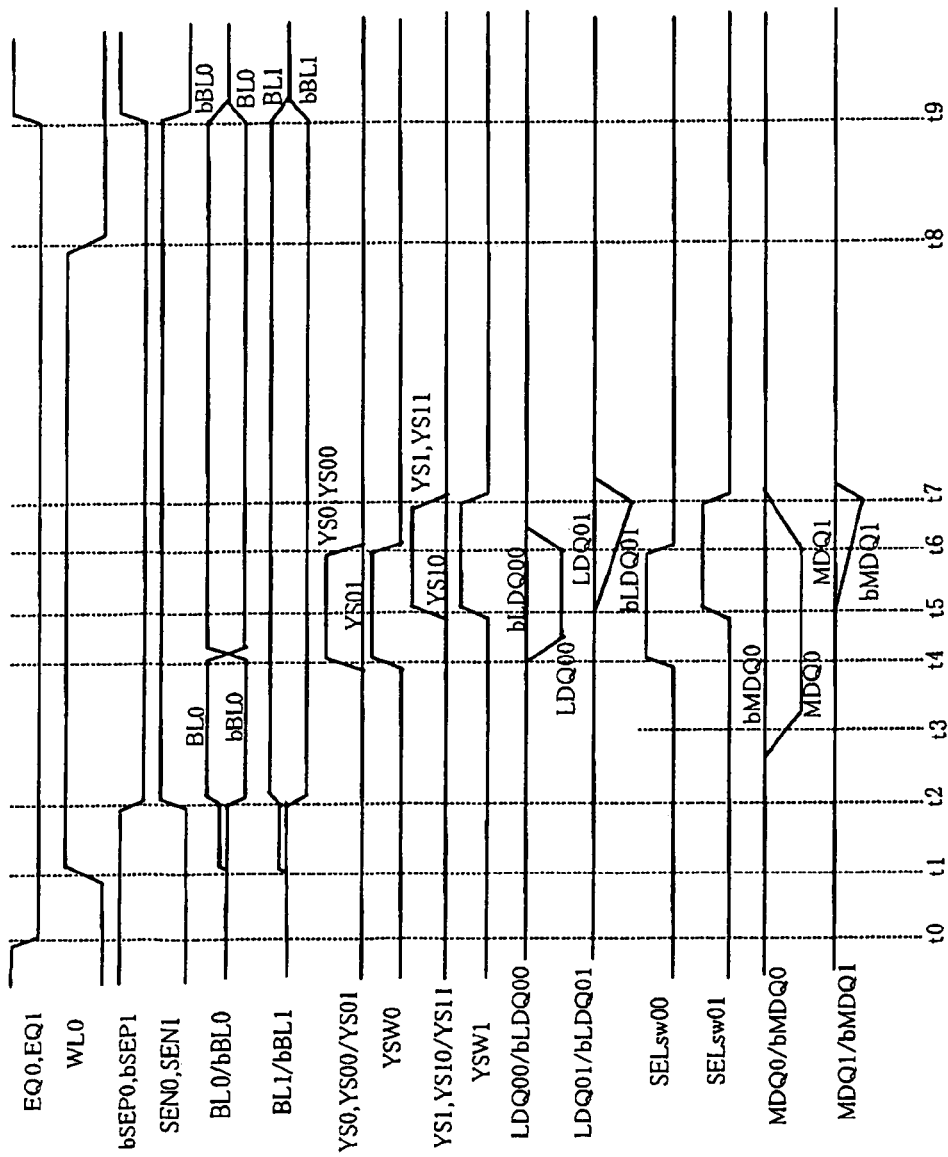
FIG. 10 depicts waveforms explaining continuous column access operations of the dynamic type semiconductor memory apparatus according to the embodiment of the present invention shown in FIG. 9.

FIG. 10 shows waveforms explaining the continuous column access operation of the dynamic type semiconductor memory apparatus according to another embodiment of the present invention. In a non-limiting example, if the data read operation from the memory cell MC2 is started immediately after the data write operation to the memory cell MC0 starts, then a continuous column access operation of the two memory cells that are selectively driven by the same word line WL0 is achieved.

In FIG. 10, the operations between a time t0 and a time t4 are the same as previously explained in FIG. 8. Thus, the data write operation to the memory cell MC0 starts during that time interval. At a time t5, the internal control circuit sets the column address selection line YS1 to the "H" level, and at the same time, it sets the column decode selection signal YSW1 to the "H" level in order to set the column selection gate DG11 to an "on" status. In this embodiment, when the reading operation is performed immediately after the writing operation, it becomes possible to enter a next reading operation even when the column address selection line YS0 is in the "H" level status. Thus, the memory apparatus starts the reading operation to the memory cell MC2 by selecting the next reading address without waiting until a time t6 for changing the column address selection line YS0 and the column decode selection signal YSW0 to the "L" level after sufficiently writing data into the memory cell MC0.

At a time t5 when the column address selection line YS1 and column decode selection signal YSW1 are changed to the "H" level, the decoded column address selection line YS11 changes to the "H" level and the column selection gate DG11 changes to the "on" status. Consequently, the data in the memory cell MC2 is read out into the local data line pair LDQ1/bLDQ1 after the operations are performed as explained in FIG. 8. According to this embodiment, in addition to the features of the previous embodiment, it becomes possible to overlap the data write operation and the data read operation because the address selection line decode circuits YDEC10–YDEC13 have latching functions. Thus, it becomes possible to achieve a continuous column access operation of the dynamic type semiconductor memory apparatus at a high speed.

In this embodiment, the address selection line decode circuits YDEC10–YDEC13 are configured by two NAND circuits and each NAND circuit has three inputs and two inverters. Alternatively, it is possible to use another feature of the logic circuit so far as it has a latching function for realizing operations of the decoded column address selection lines YS00–YS11 as explained in FIG. 10.

The embodiments of the present invention are not limited to such configurations that a bit line pair, a local data line pair, a master data line pair and a global data line pair change to complementary signal levels when data is transferred. Although the above-explained embodiments used a DRAM cell that includes one capacitor and one transistor, the present invention is widely applicable to such a dynamic type semiconductor memory apparatus which has an architecture for transferring data by a data line connecting between a data write buffer and a data read buffer that are disposed in an outside area of the memory cell alley. In particular, recent developments of the fining technology and an accompanying capacity increase of a memory make a memory cell open to a possible size minimizing. As explained above, the present invention can achieve a high speed of continuous column access operations while restraining to a minimum a size increase of a chip.

Other embodiments consistent with the present invention will be apparent to those skilled in the art from consideration of the specification and practice of the present invention disclosed herein. It is intended that the specification and examples be considered as exemplary only, with a true scope and spirit of the present invention being indicated by the following claims.

What is claimed is:

1. A dynamic type semiconductor memory apparatus, comprising:
    a memory cell alley including a plurality of memory cells disposed repeatedly along row and column directions;
    a word line configured to selectively drive the memory cell alley based on a row address being input from an external unit;
    first and second memory cell groups determined by dividing the selectively driven memory cell alley based on a column address;
    a first bit line configured to transmit or receive first data to and from the first memory cell group;
    a second bit line configured to transmit or receive second data to and from the second memory cell group;
    first and second local data lines disposed along the row direction and adjoining the memory cell alley;
    a column selection unit configured to respectively connect the first and second bit lines to the first and second local data lines based on the column address;
    a first master data line disposed corresponding to the first local data line;
    a second master data line disposed corresponding to the second local data line;
    a local data line selecting unit configured to connect the first and second local data lines to the first and second master data lines, respectively;
    a data reading unit configured to read data from the memory cell alley by selecting the first or second master data line; and
    a data writing unit configured to write data being input from an external source by selecting the first or second master data line.

2. The dynamic type semiconductor memory apparatus according to claim 1, wherein the first and second master data lines are alternately selected by the data reading unit and the data writing unit.

3. A dynamic type semiconductor memory apparatus, comprising:
    a memory cell alley including a plurality of memory cells disposed repeatedly along row and column directions;
    a word line configured to selectively drive the memory cell alley based on a row address being input from an external unit;
    first and second memory cell groups determined by dividing the selectively driven memory cell alley based on a column address;
    a first bit line configured to transmit or receive first data to and from the first memory cell group;
    a second bit line configured to transmit or receive second data to and from the second memory cell group;
    a column address selection line decoding unit configured to output first and second column selection signals based on first and second column decode selection signals being activated in a predetermined order and the column address;
    first to fourth local data lines disposed along the row direction adjoining the memory cell alley;
    a first column selection unit configured to respectively connect the first and second bit lines to the first and second local data lines based on the first column selection signal;
    a second column selection unit configured to respectively connect the first and second bit lines to the third and fourth local data lines based on the second column selection signal;
    a first master data line disposed corresponding to the first and second local data lines;
    a second master data line disposed corresponding to the third and fourth local data lines;
    a local data line selecting unit configured to connect the first and second local data lines to the first master data line and to connect the third and fourth local data lines to the second master data line;
    a data reading unit configured to read data from the memory cell alley by selecting the first and second master data lines; and
    a data writing unit configured to write data being input from an external source by selecting the first or second master data lines,
    wherein the data reading unit and the data writing unit select the first master data line when the first column decode selection signal is activated, and select the second master data line when the second column decode selection signal is activated.

4. The dynamic type semiconductor memory apparatus according to claim 3, further comprising:

a bit line sense amplifier provided corresponding to each of the first and second bit lines so as to amplify the data from the memory cell alley;

a bit line equalizing unit provided corresponding to each of the first and second bit lines so as to pre-charge the first and second bit lines; and a sense amplifier block connected to the bit line sense amplifier and the bit line equalizing unit, wherein the first and second column address selection line decoding units are provided in the sense amplifier block.

5. The dynamic type semiconductor memory apparatus according to claim 3, wherein the data reading unit and data writing unit are connected to the first and second master data line directly through two switching units.

6. The dynamic type semiconductor memory apparatus according to claim 3, wherein the first and second master data lines are alternately selected by the data reading unit and the data writing unit.

7. A dynamic type semiconductor memory apparatus, comprising:

a memory cell alley including a plurality of memory cells disposed repeatedly along row and column directions;

a word line configured to selectively drive the memory cell alley;

first and second memory cell groups determined by dividing the memory cell alley based on a column address;

a first bit line configured to transmit or receive first data to and from the first memory cell group;

a second bit line configured to transmit or receive second data to and from the second memory cell group;

first and second local data lines disposed along the row direction and adjoining the memory cell alley;

a column selection unit configured to respectively connect the first and second bit lines to the first and second local data lines;

a first master data line disposed corresponding to the first local data line;

a second master data line disposed corresponding to the second local data line; and a local data line selecting unit configured to connect the first and second local data lines to the first and second master data lines, respectively.

8. The dynamic type semiconductor memory apparatus according to claim 7, further comprising:

a data reading unit configured to read data from the memory cell alley by selecting the first or second master data line.

9. The dynamic type semiconductor memory apparatus according to claim 8, further comprising:

a data writing unit configured to write data being input from an external source by selecting the first or second master data line.

10. The dynamic type semiconductor memory apparatus according to claim 9, further comprising:

a bit line sense amplifier provided corresponding to each of the first and second bit lines so as to amplify the data from the memory cell alley.

11. The dynamic type semiconductor memory apparatus according to claim 10, further comprising:

a bit line equalizing unit provided corresponding to each of the first and second bit lines so as to pre-charge the first and second bit lines.

12. The dynamic type semiconductor memory apparatus according to claim 11, further comprising:

a sense amplifier block connected to the bit line sense amplifier and the bit line equalizing unit, wherein the first and second column address selection line decoding units are provided in the sense amplifier block.

13. The dynamic type semiconductor memory apparatus according to claim 9, wherein the data reading unit and data writing unit are connected to the first and second master data line directly through two switching units.

14. The dynamic type semiconductor memory apparatus according to claim 9, wherein the first and second master data lines are alternately selected by the data reading unit and the data writing unit.

* * * * *